(12) United States Patent
Maezawa et al.

(10) Patent No.: US 6,388,597 B1
(45) Date of Patent: May 14, 2002

(54) Δ-Σ MODULATOR AND Δ-Σ A/D CONVERTER

(75) Inventors: Koichi Maezawa, Nagoya; Takashi Mizutani, Nagoya, both of (JP)

(73) Assignee: Nagoya Industrial Science Research Institute, Nagoya (JP)

( * ) Notice: Subject to any disclaimer, the term of this patent is extended or adjusted under 35 U.S.C. 154(b) by 0 days.

(21) Appl. No.: 09/941,938

(22) Filed: Aug. 30, 2001

(30) Foreign Application Priority Data

Feb. 28, 2001 (JP) ........................................ 2001-055069

(51) Int. Cl.[7] ............................................... H03M 1/00
(52) U.S. Cl. ........................ 341/133; 341/143; 327/100; 327/101
(58) Field of Search ................................ 341/133, 143; 327/100, 101

(56) References Cited

U.S. PATENT DOCUMENTS

| | | | | |
|---|---|---|---|---|
| 3,120,618 A | * | 2/1964 | Flinckinger et al. | ........ 307/88.5 |
| 3,234,400 A | * | 2/1966 | Hart | ............................ 307/88.5 |
| 3,273,141 A | * | 9/1966 | Hackett | ....................... 340/347 |
| 6,188,346 B1 | * | 2/2001 | Waho et al. | ................. 341/156 |
| 6,208,277 B1 | * | 3/2001 | Hellums et al. | ............. 341/133 |
| 6,229,468 B1 | * | 5/2001 | Broekaert | .................... 341/133 |
| 6,292,118 B1 | * | 9/2001 | Broekaert | .................... 341/133 |

OTHER PUBLICATIONS

Marven and Ewers, *A Simple Approach to Digital Signal Processing,* translated in Japanese by Hiroshi Yamaguchi, pp. 54–59 (discussed on page 2 of the spec.).

Waho and Yamamoto, "Application of Resonant–Tunneling Quaternary Quantizer to Ultrahigh–Speed A/D Converter," 1997 27th International Symposium on Multiple–Valued Logic, May 28–30, 1997, pp. 35–40.

Itoh et al., "10–Ghz Operation of Multiple–Valued Quantizers Using Resonant–Tunneling Device," *IEICE Transactions on Info. and Systems,* vol. E82–D, No. 5, May 1999, pp. 949–954.

Yokoyama et al. "Delta–Sigma Modulator and Delta–Sigma A/D Converter," Proceedings of the 2000 Electronic Society Conference of IEICE, C–10–3, Sep. 30–Oct. 3, 2000, p. 50.

* cited by examiner

*Primary Examiner*—Michael Tokar
*Assistant Examiner*—Khai M Nguyen
(74) *Attorney, Agent, or Firm*—Law Offices of David G. Posz

(57) ABSTRACT

A Δ-Σ converter comprises a Δ-Σ modulator and a digital filter. The Δ-Σ modulator has a comparator having two resonant tunnel diodes connected to each other in series between two terminals and a field effect transistor connected in parallel to one of the resonant tunnel diodes, a conversion input transistor for converting an input voltage into electric current, a capacitor provided so that charge amount thereof is decreased by flow of electric current through the conversion input transistor and an electric potential proportional to the charge amount is used for the input electric potential to the comparator, and a feedback transistor, to which an output of the comparator is inputted, operating in such a way as to increase the charge amount of the capacitance element when the output of the comparator becomes a high level.

20 Claims, 3 Drawing Sheets a comparatively low frequency or the like.
Δ-Σ MODULATOR AND Δ-Σ A/D CONVERTER

BACKGROUND OF THE INVENTION

The present invention relates to a DELTA-SIGMA (hereinafter referred to as Δ-Σ) modulator and a Δ-Σ A/D converter having the Δ-Σ modulator. The present invention is applicable to ultra-high communication apparatuses such as software radio and high-frequency measuring apparatuses.

An A/D (analog-digital) converter is a circuit having a function for converting an analog signal into a digital signal and indispensable as an interface between an actual world indicated by analog information and a digital signal processing circuit.

As the conventional A/D converter, there are mainly two types of A/D converter such as the flash type and the Δ-Σ type. In the flash-type A/D converter, an input voltage is divided by means of many resistances, and divided voltages are applied in parallel to comparators to convert an input analog value to a digital value. Therefore, the flash-type A/D converter is capable of operating at a very high speed but incapable of coping with variations of characteristics of elements and has difficulty in obtaining high precision (number of bits).

On the other hand, in the Δ-Σ A/D converter, an input signal is converted into a digital signal of low bit precision at a very high sampling rate. Then a signal having a required frequency is taken out from the digital signal and then high-precision digital data is obtained by converting precision in time base direction into precision in bit. The circuit is capable of coping with variation in a device parameter and making high-precision conversion. The operation principle of the Δ-Σ A/D converter is described below based on a document ("A Simple Approach to Digital Signal Processing" written by C. Marven and G. Ewers; translated by Hiroshi Yamaguchi, published by Maruzen). FIG. 1 shows a block diagram of the Δ-Σ A/D converter.

The Δ-Σ A/D converter comprises a Δ-Σ modulator (Δ-Σ quantizer) and a digital filter. The Δ-Σ modulator samples an input signal at a very high frequency and coverts the sampled input signal into a pulse density signal. The digital filter decreases a high-frequency component of the signal and converts precision in time base direction into precision in bit to thereby take out a digital signal having high precision.

FIG. 2 shows the simplest construction of the Δ-Σ modulator which is the main part of the Δ-Σ A/D converter. This circuit comprises an integrator and a comparator. This circuit integrates the deviation between an input signal and an output signal and controls an output in such a way as to minimize the deviation. The output signal becomes a pulse signal. As a result, the pulse density is so controlled as to be coincident with an input value, and a pulse density signal proportional to the input value is obtained. At this time, by setting the frequency of a clock signal for sampling much higher than a Nyquist frequency, the A/D converter is capable of obtaining high precision.

As described above, because this circuit has high precision by increasing the sampling rate, the circuit of the Δ-Σ A/D converter has advantages that it is capable of coping with variations of a circuit parameter than the flash-type A/D converter and does not require a high-precision analog element in obtaining high precision.

In the Δ-Σ A/D converter having the above-described characteristics, a very high sampling frequency is necessary for a frequency of a signal to be obtained. Thus the conventional art constructed of a transistor, an operational amplifier, and the like has a problem that it can be used only for an audio signal having a comparatively low frequency or the like.

SUMMARY OF THE INVENTION

It is an object of the present invention to provide a novel Δ-Σ modulator which has overcome the problem of the conventional art and a Δ-Σ A/D converter using the Δ-Σ modulator.

The Δ-Σ modulator according to the present invention has a comparator having a plurality of negative resistance elements which show an N-type differential negative resistance and are connected to each other in series between two terminals and a comparison input transistor connected in parallel to at least one of the negative resistance elements, a clock pulse voltage being applied between the two terminals; a conversion input transistor for converting an input voltage into electric current; a capacitance element connected to an output current terminal of the conversion input transistor and to an input terminal of the comparison input transistor of the comparator; and a feedback transistor to which an output of the comparator is inputted and through which electric current flows into the capacitance element in a direction opposite to a direction of electric current flowing through the conversion input transistor. The Δ-Σ modulator is capable of achieving a high-speed operation, unlike the conventional one.

The above-described negative resistance element can be a resonant tunnel element such as a resonant tunnel diode or other elements showing a differential negative resistance such as an Esaki diode. The transistor can be a field effect transistor, a bipolar transistor or the like.

Further, the present invention is characterized in that the Δ-Σ A/D converter comprises the above-described Δ-Σ modulator and a digital filter. According to this invention, it is possible to realize a high-precision A/D converter operating at an ultra-high frequency.

DETAILED DESCRIPTION OF THE PREFERRED EMBODIMENTS (First Embodiment)

Figure 1:
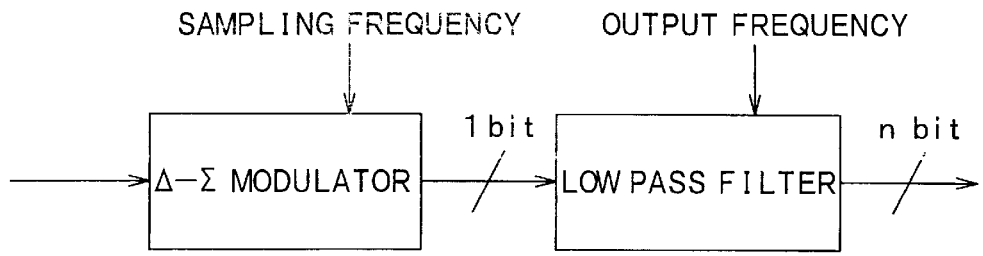
FIG. 1 shows the construction of a Δ-Σ A/D converter.
Figure 2:
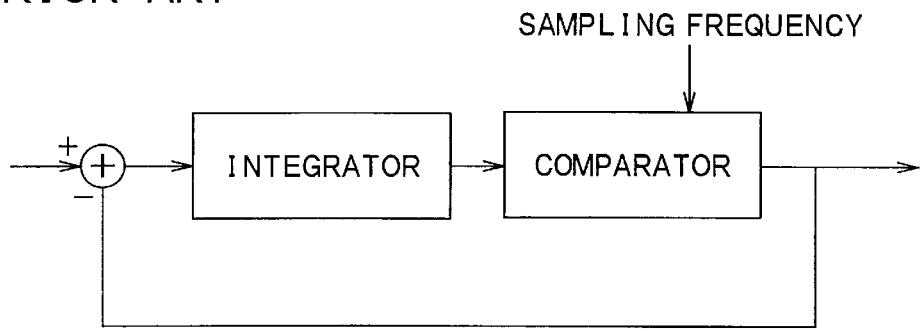
FIG. 2 shows the construction of a conventional Δ-Σ modulator.
Figure 3:
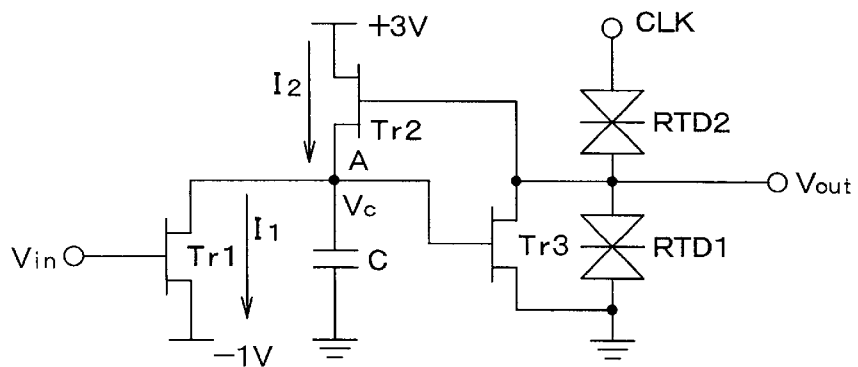
FIG. 3 shows the construction of a Δ-Σ modulator according to a first embodiment of the present invention.

FIG. 3 shows the construction of a Δ-Σ modulator according to a first embodiment of the present invention. The Δ-Σ modulator has a comparator having two resonant tunnel diodes RTD1, RTD2 connected in series with each other between two terminals (clock terminal and ground terminal) and a field effect transistor Tr3 connected in parallel with the resonant tunnel diode RTD1, an input field effect transistor Tr1, a capacitor (capacitance element) C serving as an integrator, and a feedback field effect transistor Tr2.

A clock pulse voltage is applied between the clock terminal and the ground terminal. An input voltage Vin is inputted to the input transistor Tr1.

A resonant tunnel element indicated as the resonant tunnel diodes RTD1, RTD2 is a negative resistance element showing an N-type (voltage control type) differential negative resistance in a current-voltage characteristic.

The comparator having the resonant tunnel diodes RTD1, RTD2 and the field effect transistor Tr3 is known as a monostable-bistable transfer logical element (MOBILE) and has the characteristic of a high-speed, an edge trigger (output is determined by input value at rise time of clock), and a latch operation (value is held while clock has high level). In the embodiment, the input transistor Tr3 is connected in parallel with the resonant tunnel element RTD1 disposed at the lower side (electric potential-fixed terminal side). Thus, the comparator performs an operation of inverter type. That is, when an input electric potential to the transistor Tr3 is higher than a threshold, the comparator outputs a low-level pulse signal, whereas when the input electric potential thereto is lower than the threshold, the comparator outputs a high-level pulse signal.

In this circuit, the input transistor Tr1 is biased in a saturated region. Accordingly, irrespective of an electric potential Vc at a point A, electric current I1 proportional to the input voltage Vin flows through the input transistor Tr1. A drain of the input transistor Tr1 is connected to the capacitor C. Thus when the electric current I1 flows through the input transistor Tr1, a charge amount stored in the capacitor C decreases. Thereby the charge amount of the capacitor C decreases at a speed proportional to the input voltage Vin, and the electric potential (electric potential Vc at point A) proportional to the charge amount drops at a speed proportional to the input voltage Vin. When the electric potential Vc at the point A is higher than the threshold of the comparator, an output Vout of the comparator becomes a low level. When. the electric potential Vc at the point A is lower than the threshold thereof, the output Vout thereof becomes a high level.

When the output Vout of the comparator becomes a high level, the feedback transistor Tr2 is turned on. Thereby electric current flows into the capacitor C. The direction of this electric current is opposite to the direction of electric current flowing through the input transistor Tr1. Thereby the charge amount stored in the capacitor C increases, the electric potential Vc at the point. A rises, and the output Vout of the comparator becomes a low level. This indicates that a negative feedback is generated, and this circuit operates as the Δ-Σ modulator.

For example, when the input voltage Vin is high, the drop speed of the electric potential Vc at the point A is fast. Thus at a sampling time, there is an increase in the number of times when the electric potential Vc at the point. A becomes lower than the threshold, and the comparator outputs many pulses. On the other hand, when the input voltage Vin is low, the drop speed of the electric potential Vc at the point A is slow. Thus at the sampling time, there is an increase in the number of times when the electric potential Vc at the point A becomes higher than the threshold and the pulse density becomes low.

Figure 4A:
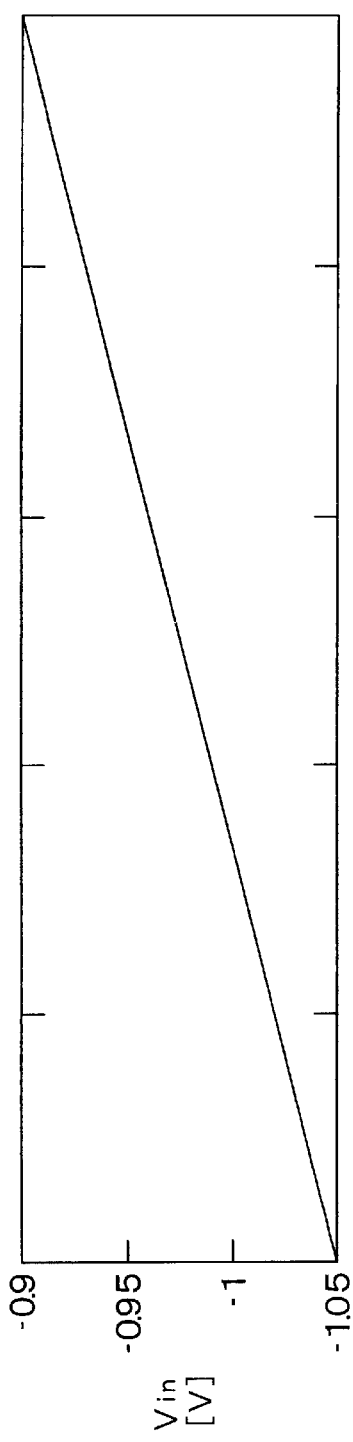
FIG. 4 shows input-output characteristics of the Δ-Σ modulator of FIG. 3.
Figure 4B:
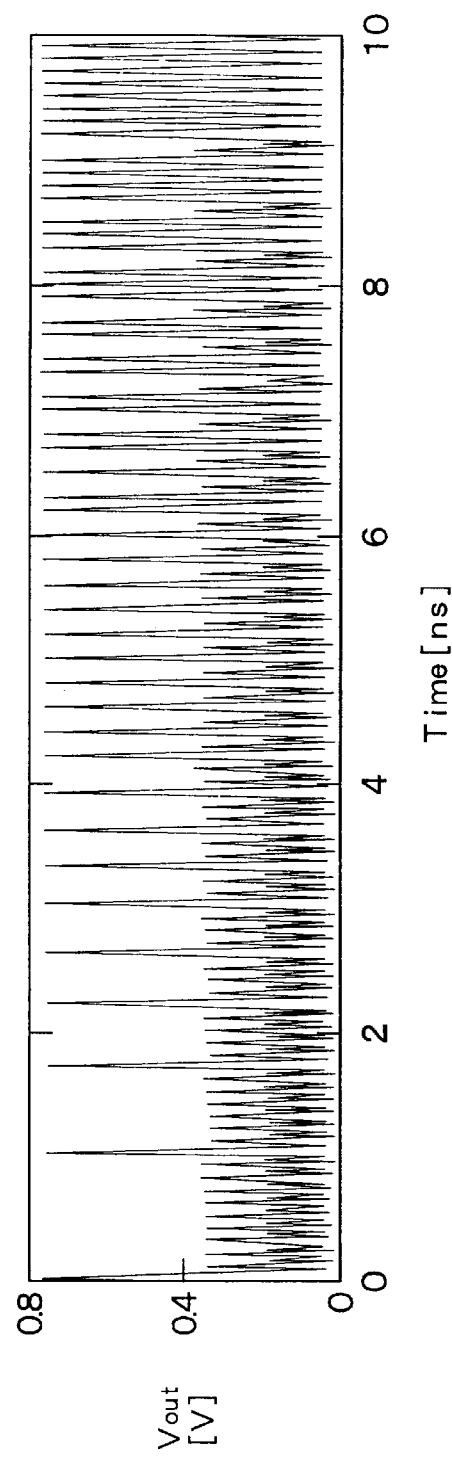

FIG. 4 shows the result of simulation of the input-output characteristic of this circuit. As shown in FIG. 4A, when the input voltage Vin is changed linearly with respect to time, the pulse density of the output Vout of the comparator changes in proportion to the input voltage Vin, as shown in FIG. 4B. Accordingly, by connecting a digital filter to the Δ-Σ modulator shown in FIG. 3, a high-speed and high-precision A/D converter can be obtained. The digital filter may be a conventional digital filter. But the digital filter operating at a higher speed than the conventional digital filter is preferable. For example, the digital filter constructed by MOBILE using the resonant tunnel element can operate at a high speed similarly to the Δ-Σ modulator.

(Second Embodiment)

Figure 5:
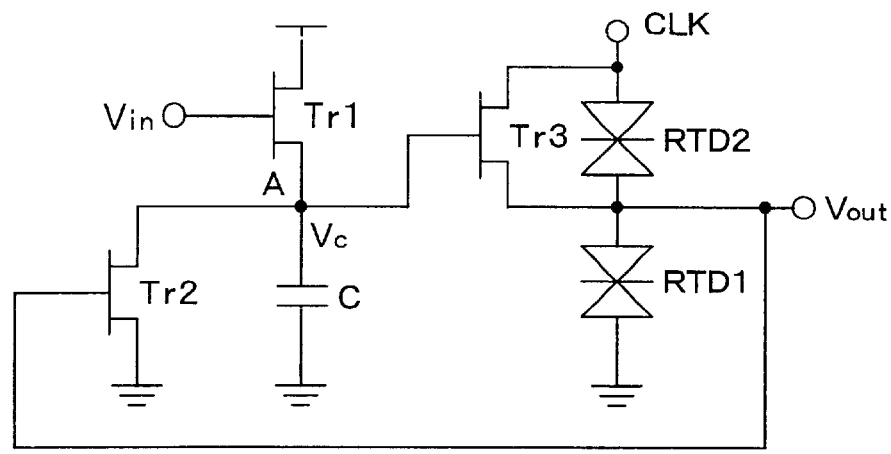
FIG. 5 shows the construction of a Δ-Σ modulator according to a second embodiment of the present invention.

FIG. 5 shows the construction of a Δ-Σ modulator according to a second embodiment of the present invention. The Δ-Σ modulator of the second embodiment is different from the Δ-Σ modulator of the first embodiment in that the input transistor Tr3 of the comparator is connected in parallel to the resonant tunnel element RTD2 disposed at the upper side. In this case, when an input electric potential is higher than a threshold, the comparator outputs a high-level pulse signal, whereas when the input electric potential is lower than the threshold, the comparator outputs a low-level pulse signal. Therefore the connection relationship between the input transistor Tr1 and that of the feedback field effect transistor Tr2 are opposite to those of the first embodiment. Accordingly in the circuit, an operation in which the high level of the voltage and the low level thereof in the second embodiment are reverse to those in the first embodiment is performed. As the output of the circuit, a pulse density signal similar to that of the first embodiment is obtained.

Since the resonant tunnel element is used for the Δ-Σ modulator of the first and second embodiments, the Δ-Σ modulator has the following many advantages: (1) the Δ-Σ modulator can be constructed with a simple circuit and thus the circuit area thereof can be reduced; (2) the Δ-Σ modulator consumers a low electric power; (3) the Δ-Σ modulator is capable of operating at a high speed; and (4) the integration can be accomplished easily.

The Δ-Σ A/D converter having the Δ-Σ modulator can be used as the high-precision A/D converter operating at an ultra-high frequency (for example, two-digit GHz). For example, the Δ-Σ A/D converter can be utilized for high-precision A/D conversion of sounds and images and A/D conversion. for a communication broad band modem, an RF band and a base band of a software radio.

(Other Embodiments)

In the above-described embodiment, the resonant tunnel element is used as the negative resistance element. But other elements such as an Esaki diode showing a negative resistance may be used. The transistor is not limited to the field effect transistor but a bipolar transistor may be used as the transistor.

Figure 6:
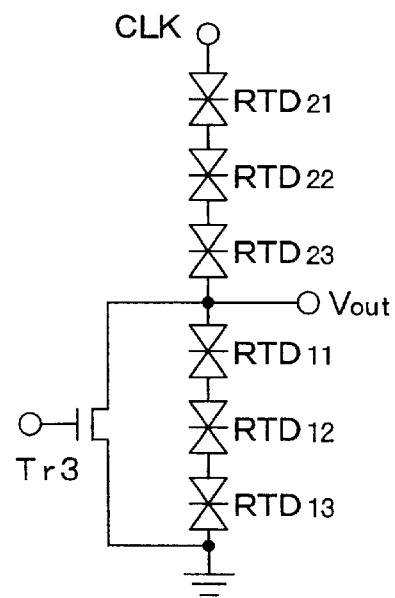
FIG. 6 shows the construction of another example of a comparator shown in FIG. 3.

Further, as described in a document "Proceedings of 27th International Symposium on Multiple-Valued Logic, 1997, pp. 35–40", the comparator obtaining a multi-valued output can be composed by increasing the number of negative resistance elements connected to each other in series. For example, the comparator of the first embodiment may be constructed as shown in FIG. 6. That is, resonant tunnel elements RTD11—RTD13 and RTD21—RTD23 are connected to each other in series respectively, and the transistor Tr3 is connected in parallel to the resonant tunnel elements RTD11—RTD13. In case of the comparator of the second embodiment, the transistor Tr3 is connected in parallel to the resonant tunnel elements RTD21—RTD23.

What is claimed is:

1. A Δ-Σ modulator comprising:
   a comparator having a plurality of negative resistance elements which show an N-type differential negative resistance and are connected to each other in series between two terminals and a comparison input transistor connected in parallel to at least one of said negative resistance elements, a clock pulse voltage being applied between said two terminals;

a conversion input transistor for converting an input voltage into electric current;

a capacitance element connected to an output current terminal of said conversion input transistor and to an input terminal of said comparison input transistor of said comparator; and a feedback transistor to which an output of said comparator is inputted and through which electric current flows into said capacitance element in a direction opposite to a direction of electric current flowing through said conversion input transistor.

2. A Δ-Σ modulator according to claim 1, wherein the number of said negative resistance elements connected in series to each other between said two terminals is two, and said comparison input transistor is connected in parallel to one of two negative resistance elements.

3. A Δ-Σ modulator according to claim 1, wherein said negative resistance element is a resonant tunnel element.

4. A Δ-Σ modulator according to claim 1, wherein each of said comparison input transistor, said conversion input transistor, and said feedback transistor is a field effect transistor.

5. A Δ-Σ modulator comprising:

a comparator having two negative resistance elements which show an N-type differential negative resistance and are connected to each other in series between two terminals and a comparison input transistor connected in parallel to one of said two negative resistance elements, a clock pulse voltage being applied between said two terminals, and said comparator outputting a low-level pulse signal when an input electric potential is higher than a threshold and outputting a high-level pulse signal when said input. electric potential is lower than said threshold;

a conversion-input transistor, for converting an input voltage into electric current, having an output current terminal connected to an input terminal of said comparison input transistor;

a capacitance element provided so that charge amount thereof is decreased by flow of electric current through said conversion input transistor and an electric potential proportional to said charge amount is used for said input electric potential to said comparator; and a feedback transistor, to which an output of the comparator is inputted, operating in such a way as to increase the charge amount of the capacitance element when the output of the comparator becomes a high level.

6. A Δ-Σ modulator according to claim 5, wherein said negative resistance element is a resonant tunnel element.

7. A Δ-Σ modulator according to claim 5, wherein each of said comparison input transistor, said conversion input transistor, and said feedback transistor is a field effect transistor.

8. Δ-Σ modulator comprising:

a comparator having two negative resistance elements which show an N-type differential negative resistance and are connected to each other in series between two terminals and a comparison input transistor connected in parallel to one of said two negative resistance elements, a clock pulse voltage being applied between said two terminals, and said comparator outputting a low-level pulse signal when an input electric potential is higher than a threshold and outputting a high-level pulse signal when said input electric potential is lower than said threshold;

a conversion input transistor, for converting an input voltage into electric current, having an output current terminal connected to an input terminal of said comparison input transistor;

a capacitance element provided so that charge amount thereof is decreased by flow of electric current through said conversion input transistor and an electric potential proportional to said charge amount is used for said input electric potential to said comparator; and a feedback transistor, to which an output of the comparator is inputted, operating in such a way as to increase the charge amount of the capacitance element when the output of the comparator becomes a high level.

9. A Δ-Σ modulator according to claim 8, wherein said negative resistance element is a resonant tunnel element.

10. A Δ-Σ modulator according to claim 8, wherein each of said comparison input transistor, said conversion input transistor, and said feedback transistor is a field effect transistor.

11. A Δ-Σ converter comprising:

a comparator having a plurality of negative resistance elements which show an N-type differential negative resistance and are connected to each other in series between two terminals and a comparison input transistor connected in parallel to at least one of said negative resistance elements, a clock pulse voltage being applied between said two terminals;

a conversion input transistor for converting an input voltage into electric current;

a capacitance element connected to an output current terminal of said conversion input transistor and to an input terminal of said comparison input transistor of said comparator;

a feedback transistor to which an output of said comparator is inputted and through which electric current flows into said capacitance element in a direction opposite to a direction of electric current flowing through said conversion input transistor; and a digital filter to which an output of said comparator is inputted.

12. A Δ-Σ converter according to claim 11, wherein the number of said negative resistance elements connected in series to each other between said two terminals is two, and said comparison input transistor is connected in parallel to one of two negative resistance elements.

13. A Δ-Σ converter according to claim 11, wherein said negative resistance element is a resonant tunnel element.

14. A Δ-Σ converter according to claim 11, wherein each of said comparison input transistor, said conversion input transistor, and said feedback transistor is a field effect transistor.

15. A Δ-Σ converter comprising:

a comparator-having two negative resistance elements which show an N-type differential negative resistance and are connected to each other in series between two terminals and a comparison input transistor connected in parallel to one of said two negative resistance elements, a clock pulse voltage being applied between said two terminals, and said comparator outputting a low-level pulse signal when an input electric potential is higher than a threshold and outputting a high-level pulse signal when said input electric potential is lower than said threshold;

a conversion input transistor, for converting an input voltage into electric current, having an output current terminal connected to an input terminal of said comparison input transistor;

a capacitance element provided so that charge amount thereof is decreased by flow of electric current through said conversion input transistor and an electric potential proportional to said charge amount is used for said input electric potential to said comparator; and a feedback transistor, to which an output of the comparator is inputted, operating in such a way as to increase the charge amount of the capacitance element when the output of the comparator becomes a high level; and a digital filter to which an output of said comparator is inputted.

16. A Δ-Σ converter according to claim 15, wherein said negative resistance element is a resonant tunnel element.

17. A Δ-Σ converter according to claim 15, wherein each of said comparison input transistor, said conversion input transistor, and said feedback transistor is a field effect transistor.

18. A Δ-Σ converter comprising:

a comparator having two negative resistance elements which show an N-type differential negative resistance and are connected to each other in series between two terminals and a comparison input transistor connected in parallel to one of said two negative resistance elements, a clock pulse voltage being applied between said two terminals, and said comparator outputting a high-level pulse signal when an input electric potential is higher than a threshold and outputting a low-level pulse signal when said input electric potential is lower than said threshold;

a conversion input transistor, for converting an input voltage into electric current, having an output current terminal connected to an input terminal of said comparison input transistor;

a capacitance element provided so that charge amount thereof is decreased by flow of electric current through said conversion input transistor and an electric potential proportional to said charge amount is used for said input electric potential to said comparator; and a feedback transistor, to which an output of the comparator is inputted, operating in such a way as to increase the charge amount of the capacitance element when the output of the comparator becomes a high level.

19. A Δ-Σ converter according to claim 18, wherein said negative resistance element is a resonant tunnel element.

20. A Δ-Σ converter according to claim 18, wherein each of said comparison input transistor, said conversion input transistor, and said feedback transistor is a field effect transistor.

* * * * *